(12) United States Patent
Donchev et al.

(10) Patent No.: US 7,951,276 B2
(45) Date of Patent: May 31, 2011

(54) CLUSTER GENERATOR

(75) Inventors: Todor I. Donchev, Urbana, IL (US);
Ivan G. Petrov, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 1015 days.

(21) Appl. No.: 11/810,904

(22) Filed: Jun. 7, 2007

(65) Prior Publication Data
US 2009/0255802 A1   Oct. 15, 2009

Related U.S. Application Data

(60) Provisional application No. 60/811,957, filed on Jun. 8, 2006.

(51) Int. Cl.
*C23C 14/34* (2006.01)
(52) U.S. Cl. .......... 204/298.12; 204/298.09; 204/298.14
(58) Field of Classification Search ............. 204/298.12, 204/298.14
See application file for complete search history.

(56) References Cited

U.S. PATENT DOCUMENTS

| | | | |
|---|---|---|---|
| 4,521,286 A | 6/1985 | Horwitz | |
| 4,714,860 A * | 12/1987 | Brown et al. | 315/111.81 |
| 4,824,544 A * | 4/1989 | Mikalesen et al. | 204/298.06 |
| 5,110,435 A | 5/1992 | Haberland | |
| 5,334,302 A * | 8/1994 | Kubo et al. | 204/298.18 |
| 5,728,280 A | 3/1998 | Scherer | |
| 6,217,716 B1 | 4/2001 | Fai Lai | |
| 6,337,001 B1 * | 1/2002 | Haag et al. | 204/192.2 |
| 6,352,626 B1 * | 3/2002 | von Zweck | 204/298.04 |
| 6,392,188 B1 * | 5/2002 | Milani et al. | 219/121.43 |
| 6,444,100 B1 | 9/2002 | McLeod | |

OTHER PUBLICATIONS

Milani, P.; Piseri, P.; Barborini, E.; Podesta, A.; Lenardi, C. "Cluster Beam Synthesis of Nanostructured Thin Films"; *J. Vac. Sci. Technol. A*, 2001, 19:4, 2025-2033.

* cited by examiner

*Primary Examiner* — Nam X Nguyen
*Assistant Examiner* — Jason M Berman
(74) *Attorney, Agent, or Firm* — Brinks Hofer Gilson & Lione

(57) ABSTRACT

Described herein is an apparatus and a method for producing atom clusters based on a gas discharge within a hollow cathode. The hollow cathode includes one or more walls. The one or more walls define a sputtering chamber within the hollow cathode and include a material to be sputtered. A hollow anode is positioned at an end of the sputtering chamber, and atom clusters are formed when a gas discharge is generated between the hollow anode and the hollow cathode.

29 Claims, 10 Drawing Sheets

US 7,951,276 B2

CLUSTER GENERATOR

RELATED APPLICATIONS

The present patent document claims the benefit of the filing date under 35 U.S.C. §119(e) of U.S. Provisional Patent Application Ser. No. 60/811, 957, filed Jun. 8, 2006, which is hereby incorporated by reference.

FEDERALLY SPONSORED RESEARCH OR DEVELOPMENT

The United States has contractual rights in this invention pursuant to contract number DE-FG02-91-ER45439 between the U.S. Department of Energy and the University of Illinois at Urbana-Champaign.

TECHNICAL FIELD

The present disclosure relates generally to production systems for atom clusters and more particularly to a vacuum cluster generator based on a hollow cathode.

BACKGROUND

Vapor phase methods can be employed to produce particles or thin films. Sputtering, a physical vapor deposition (PVD) technique, is widely used to produce thin films for commercial applications. The method can also be applied to the formation of atom clusters.

A typical sputtering apparatus 10 is shown schematically in FIG. 1A. The apparatus 10 includes a vacuum deposition chamber 12, a planar sputtering target (cathode) 14 and a substrate 16. To sputter deposit a thin film, the sputtering target 14 may be biased with a negative voltage, and an inert gas between the target 14 and the walls of the chamber 12 may be ionized, forming a plasma. Positive ions from the plasma are attracted to the surface of the negatively charged sputtering target 14, where they sputter (eject) atoms from the surface. Electrons are also ejected by ion impact and accelerated to further ionize the gas. Some portion of the ejected atoms are deposited on the substrate 16 to form a thin film. Other material sputtered from the target 14 may be deposited on the walls of the vacuum deposition chamber 12 and lost.

A typical atom cluster generator based on a sputtering process is shown schematically in FIG. 1B. Atom clusters produced in the sputtering chamber 12 at a sufficiently high pressure pass through an aperture in the wall separating the sputtering chamber 12 and the deposition chamber 20. Some portion of the atom clusters are deposited on the substrate 16 facing the cathode 14 to form a cluster deposit or thin film.

Sputtering has been optimized for commercial production of thin films. Sputter deposition is typically carried out in stand-alone vacuum systems with volumes on the order of 1000-10,000 cm$^3$ or more. Magnetically enhanced sputtering (e.g., magnetron sputtering) is widely used to improve sputtering efficiency. Thin film deposition rates may increase by several orders of magnitude when magnets are used to control the path of electrons in the vicinity of the target surface.

It would be advantageous to develop a compact, portable apparatus for the vapor phase production of atom clusters. Ideally, the apparatus would have low material losses and produce clusters efficiently without the use of magnets. It would also be advantageous if the apparatus facilitated in-situ characterization of the generated atom clusters and provided flexible control over the composition of multielement atom clusters. It would be further desirable if the apparatus was scalable for high-volume cluster production.

BRIEF SUMMARY

Disclosed herein is an apparatus and method for generating atom clusters that may provide advantages over existing systems and methods.

The apparatus includes a hollow cathode comprising one or more walls. The walls define a sputtering chamber within the hollow cathode and comprise a material to be sputtered. A hollow anode is disposed at an end of the sputtering chamber, and atom clusters are formed when a gas discharge is generated in the sputtering chamber.

The method for producing atom clusters includes providing a hollow cathode having one or more walls. The walls define a sputtering chamber within the hollow cathode and comprise a material to be sputtered. A hollow anode is provided at an end of the sputtering chamber. A gas discharge is generated between the anode and the hollow cathode, and atom clusters including the material are formed.

DETAILED DESCRIPTION

Described herein is an apparatus ("cluster generator") and a method for generating clusters based on a gas discharge within a hollow cathode.

Figure 1A:
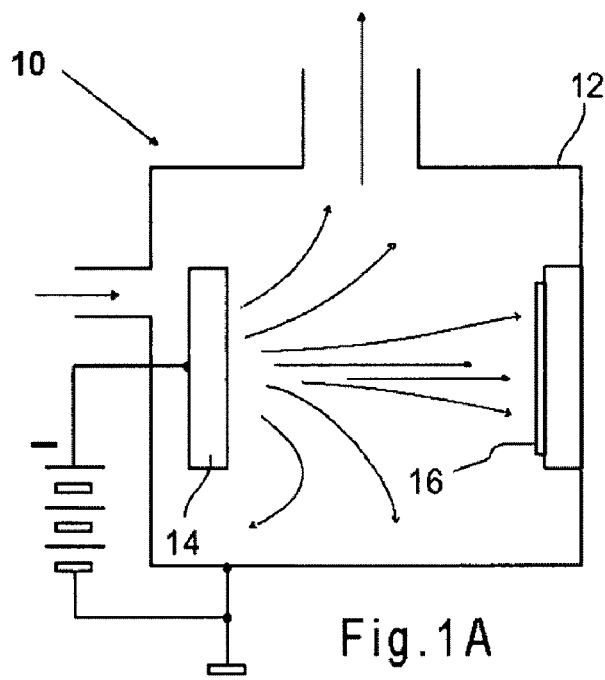
FIG. 1A is a schematic of a typical sputtering apparatus.
Figure 1B:
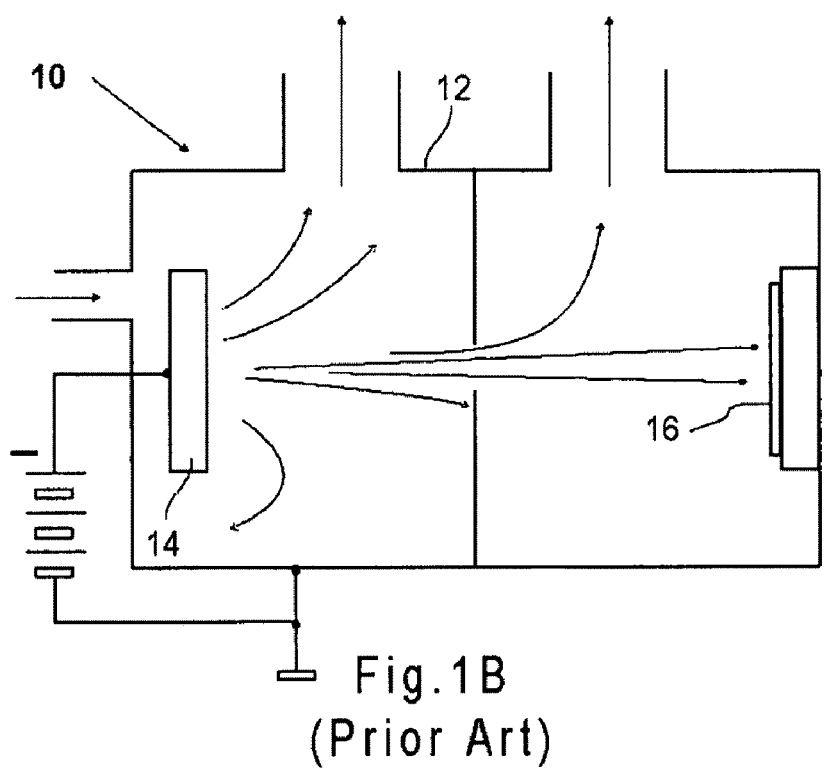
FIG. 1B is a schematic of a typical atom cluster generator.
Figure 2:
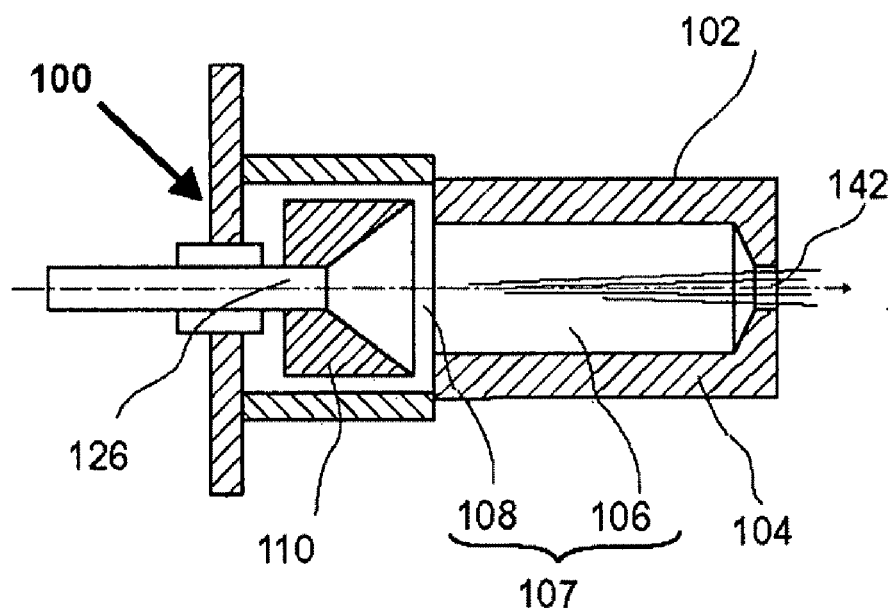
FIG. 2 is a cross-sectional view of an atom cluster generator according to a first embodiment.

The cluster generator 100 is shown in cross-section according to a first embodiment in FIG. 2. The cluster generator includes a hollow cathode 102 having one or more walls 104. The wall(s) 104 define a sputtering chamber 106 within the hollow cathode 102. A spacer region 108 separates the hollow cathode 102 from an anode 110 positioned at an end of the sputtering chamber 106. The anode 110 is preferably hollow. The anode 110 and the hollow cathode 102 are electrically isolated from each other by the spacer region 108 surrounding the anode 110. According to the first embodiment, the anode 110 includes a gas inlet 126 for introduction of a "working gas" into the chamber, as will be further discussed below. The sputtering chamber 106 and the spacer region 108 form a first chamber 107.

Atom clusters are generated by a sputtering process that occurs in the presence of a gas discharge between the hollow cathode 102 and the anode 110 in the sputtering chamber 106. The wall(s) 104 of the hollow cathode 102 serve as the source of material for sputtering. To generate the gas discharge, the working gas is ionized between the anode 110 and the cathode 102. The hollow cathode 102 attracts positive ions from the ionized gas, or plasma. The positive ions are accelerated to a high kinetic energy and strike the walls 104 of the hollow cathode 102, where part of the kinetic energy is converted to heat, and the remainder of the energy is imparted to atoms or molecules of the walls 104 by momentum transfer. Atoms or molecules from that gain sufficient energy in the sputtering process to overcome their binding energy escape from the walls 104 and are ejected into the sputtering chamber 106, forming a vapor. Electrons ejected from the hollow cathode 102 are accelerated toward the anode 110, colliding with other working gas atoms in their path to further ionize the working gas. By controlling various parameters of the sputtering process, as discussed below, clusters may be condensed from the vapor in the working gas atmosphere.

The cluster generator 100 includes an aperture 142 for extracting the atom clusters from the sputtering chamber 106. Sputtered vapor that has not condensed into clusters may also travel through the aperture 142. A substrate or other collection device may be disposed adjacent to the aperture 142 for collection and/or deposition of the clusters. It should be noted that vapor or atom clusters that do not pass through the aperture 142 may be redeposited on the walls of the hollow cathode 102 and sputtered again. Accordingly, material losses may be minimized. This feature may be particularly advantageous in the case of expensive cathode materials, such as precious metals, or for large-scale cluster deposition where material utilization may be a critical factor in the economics of the cluster generation process.

Figure 3:
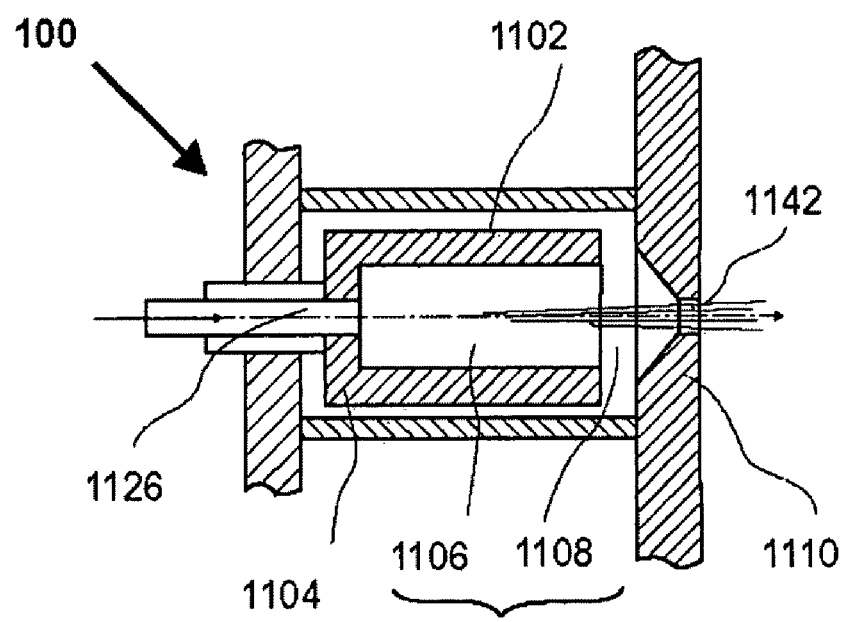
FIG. 3 is a cross-sectional view of an atom cluster generator according to a second embodiment.

In the first embodiment of the cluster generator 100 shown in FIG. 2, the hollow cathode 102 includes the aperture 142. According to a second embodiment of the cluster generator 100 shown in FIG. 3, the anode 1110 includes the aperture 1142. Referring to FIG. 3, the hollow cathode 1102 includes one or more walls 1104 that define the sputtering chamber 1106, as in the first embodiment. The spacer region 1108 surrounds the hollow cathode 1102 to electrically isolate the hollow cathode 1102 from the anode 1110. The anode 1110 is positioned at an end of the sputtering chamber 1106 and includes the aperture 1142 for extraction of atom clusters from the chamber 1106. According to this embodiment, the hollow cathode 1102 includes the gas inlet 1126 for introduction of the working gas into the sputtering chamber 1106. The sputtering chamber 1106 and the spacer region 1108 form the first chamber 1107.

The hollow anode 110, 1110 of the first or second embodiment of the cluster generator 100 preferably has a tapered interior surface for passage of the working gas and/or the atom clusters. The interior surface may have a funnel-like configuration, for example, and a generally circular cross-section. Alternatively, the interior surface may have a different cross-section, such as, for example, an oval, square, rectangular or polygonal cross-section. A diameter or other linear dimension (e.g. height, width) of the interior surface preferably increases along a length of the hollow anode 110, 1110 in a direction of the hollow cathode 102, 1102. Alternatively, the interior surface of the hollow anode 110, 1110 may have a constant diameter (or other linear dimension) along its length.

Figure 4:
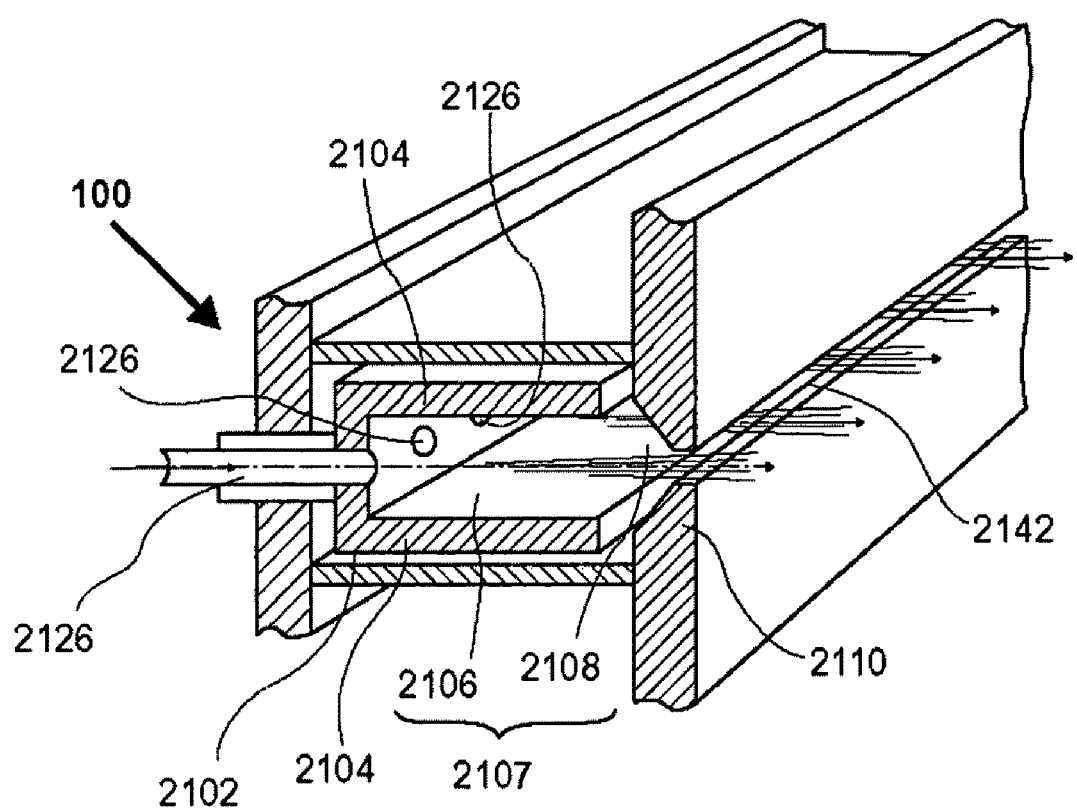
FIG. 4 is a sectional perspective view of an atom cluster generator according to a third embodiment.

The hollow cathode 102, 1102 of the first or second embodiment may have a generally hollow cylindrical or tubular shape and may include one wall 104, 1104. Alternatively, the hollow cathode of the first or second embodiment may have another hollow shape, such as, for example, a hollow prismatic, cubic, tetragonal, parallelepipedic, spheroidal, or spherical shape. Depending on the shape, the hollow cathode may include more than one wall. The walls may be curved or planar. Referring to FIG. 4, which shows a third embodiment of the cluster generator 100, the hollow cathode 2102 may include two oppositely disposed planar walls 2104. Preferably, the oppositely disposed planar walls 2104 are spaced apart by a substantially uniform distance. According to this embodiment, the planar walls 2104 may be substantially larger in one dimension (e.g., depth or width) than in the other two dimensions (e.g., height and length), as further discussed below. According to another embodiment, the hollow cathode may include two oppositely disposed nonplanar walls that follow a curved path to form an annular, coaxial, spiral, s-shaped, or other curved configuration. The oppositely disposed nonplanar walls may also be spaced apart by a substantially uniform distance.

The walls of the hollow cathode are composed of a material to be sputtered. A portion or an entirety of the walls may be composed of the material, which may be a metal, semiconductor, alloy, or compound. Preferably, the material is conductive. The material may include, for example, one or more of the following elements: Al, Sc, Ti, V, Cr, Mn, Fe, Co, Ni, Cu, Zn, Y, Zr, Nb, Mo, Ru, Rh, Pd, Ag, Cd, In, La, Ce, Pr, Nd, Pm, Sm, Eu, Gd, Tb, Dy, Ho, Er, Tm, Yb, Lu, Hf, Ta, W, Re, Os, Ir, Pt, Au, Pb, Bi, Po, Th, U, Np, Pu, Si, C, Ga, Ge, As, Se, Sn, Sb, Te, Li, Be, Na, Mg, K, Ca, Rt, Sr, or Ba.

Figure 5:
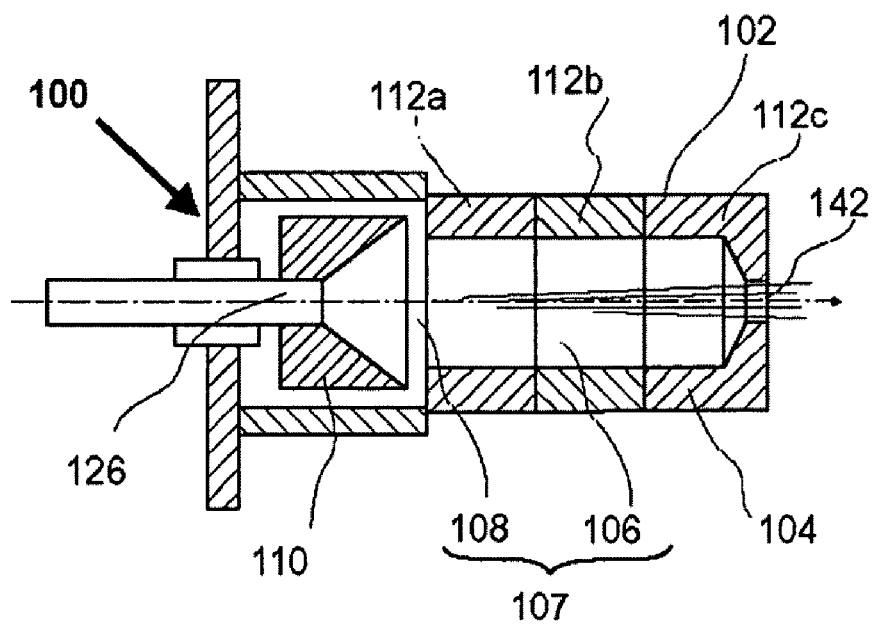
FIG. 5 is a cross-sectional view of an atom cluster generator according to a fourth embodiment.
Figure 6:
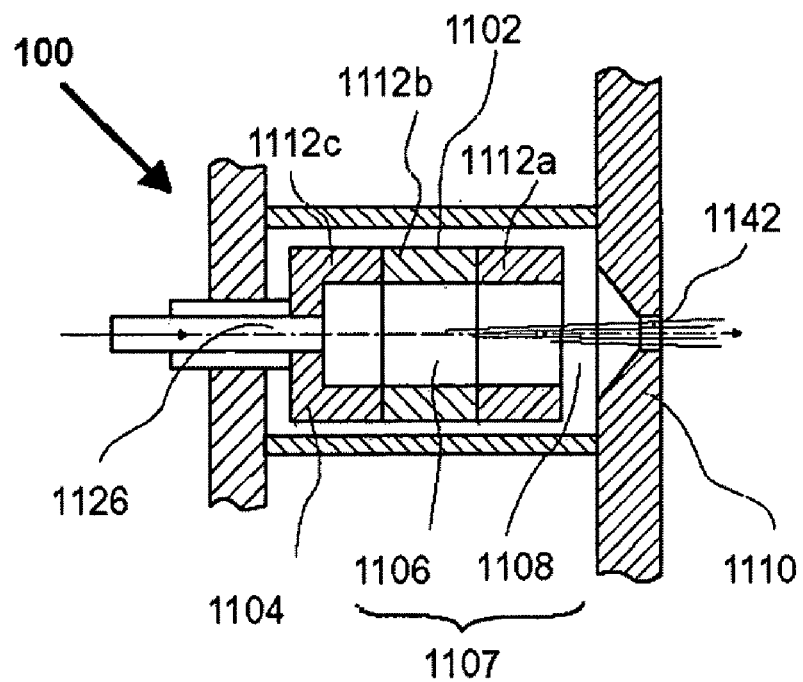
FIG. 6 is a cross-sectional view of an atom cluster generator according to a fifth embodiment.

The walls of the hollow cathode may include more than one material. According to one embodiment, the walls may be composed of several sections of different materials or of same and different materials (e.g., alternating sections). The sections may be, for example, perforated plates, disks or rings that are stacked to form the walls. FIG. 5 shows a fourth embodiment of the cluster generator 100 in which the hollow cathode 102 includes an annular section 112a of a first element, an annular section 112b of a second element, and an annular section 112c of a third element. FIG. 6 shows a fifth embodiment of the hollow cathode 1102 including sections 1112a, 1112b, 1112c of different materials. By using more than one section 112, 1112 or material to form the wall or walls 104, 1104 of the hollow cathode 102, 1102, it may be possible to form clusters of various compositions. For example, it may be possible to form a mixture of single-element atom clusters, i.e., atom clusters of the first element, atom clusters of the second element, atom clusters of the third element, etc. It may also be possible to form multi-element atom clusters that include within each cluster two or more of the first, second and third elements.

For some embodiments, it may be advantageous for the cluster generator 100 to have a compact size. For example, the cluster generator 100 may be part of a portable system that can be readily attached to and removed from a small or large vacuum chamber for collection, study, and/or further processing of the generated clusters. In addition, a compact size in combination with the hollow cathode geometry may be advantageous for achieving high sputtering rates without using magnets to generate a magnetic field in the sputtering chamber, as discussed further below.

Accordingly, the hollow cathode may have a length in the range of from about 0.5 cm to about 4 cm. The length may also be in the range of from about 1 cm to about 3 cm. An inner diameter or other interior dimension of the hollow cathode (e.g., height or depth of the sputtering chamber) may be in the range of from about 0.2 cm to about 1.8 cm. The inner diameter or other interior dimension may also be in the range of from about 0.5 cm to about 1.5 cm. An outer diameter or other exterior dimension (e.g., height or depth) of the hollow cathode may be in the range from about 0.5 cm to about 4 cm. The outer diameter or other exterior dimension may also be in the range of from about 1 cm to about 3 cm. Preferably, the hollow cathode has no dimension greater than about 4 cm. It may also be advantageous that the hollow cathode has no dimension greater than about 3 cm. The sputtering chamber preferably has a volume of about 10 $cm^3$ or less. Even more preferably, the volume is about 6 $cm^3$ or less. The sputtering chamber may also have a volume of about 4 $cm^3$ or less, about 2 $cm^3$ or less, or about 1 $cm^3$ or less.

Alternatively, it may be advantageous for the cluster generator 100 to have two small dimensions as described above and another arbitrarily large dimension. Such a configuration may allow large-scale areas to be covered with clusters. For example, a height and length of the cluster generator 100 may be small and a depth (or width) of the apparatus may be large, as shown in FIG. 4. The depth or width of the walls 2104 of the hollow cathode 2102 may be in the range of from about 1.5 cm to about 1,000 cm, according to this embodiment. The depth or width may also be in the range of from about 10 cm to about 100 cm. The sputtering chamber 2106 may have a volume greater than about 10 $cm^3$ according to this embodiment. For example, the volume may be about 100 $cm^3$ or greater, or about 1,000 $cm^3$ or greater. It should also be noted that large-scale cluster production may be achieved using an array of compact cluster generators that have a large combined sputtering chamber volume.

Referring again to FIG. 2, the aperture 142 for extracting atom clusters from the sputtering chamber 106 may have a diameter or other linear dimension in the range of from about 0.1 cm to about 0.4 cm. The diameter or other linear dimension of the aperture 142 may also lie in the range of from about 0.2 cm to about 0.3 cm. It is also contemplated that the aperture 142 may include one large dimension to provide an elongated opening. For example, the aperture 142 may have a first linear dimension (e.g., height or length) within the ranges mentioned above, and a second linear dimension (e.g., depth or width) much greater than the first linear dimension. For example, the second linear dimension may be 10 times greater, or 20 times greater than the first linear dimension. Such an elongated aperture 2142 may be positioned in opposition to a series of gas inlets 2126, as shown for example in FIG. 4, thereby allowing for more efficient production and extraction of atom clusters and vapor from the sputtering chamber. According to another embodiment, the cluster generator may include a plurality of apertures arranged in, for example, a showerhead-like configuration in opposition to one or more gas inlets.

Figure 7:
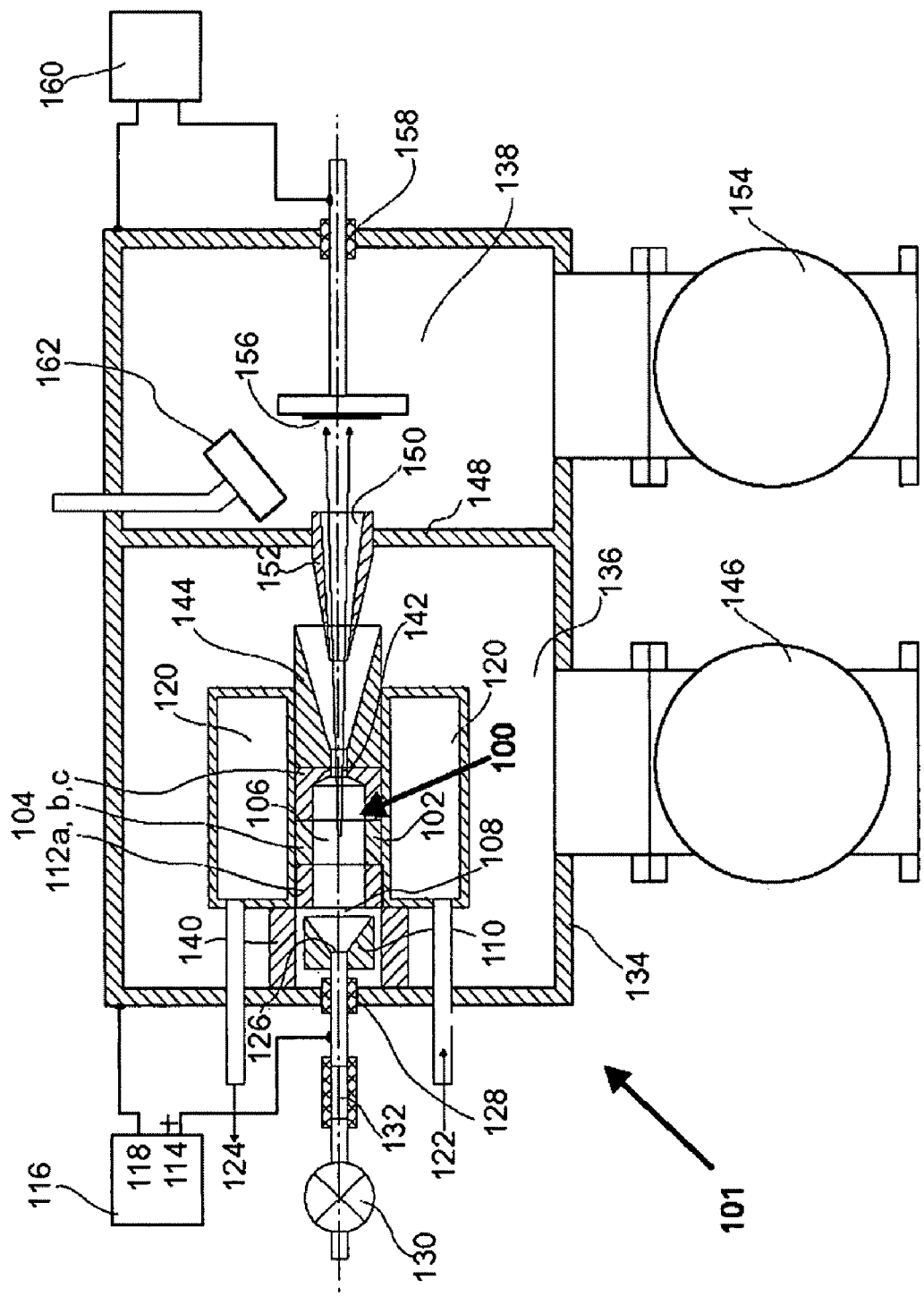
FIG. 7 is a cross-sectional view of a cluster deposition apparatus according to one embodiment.

FIG. 7 shows a cluster deposition apparatus 101 including the cluster generator 100 according to one embodiment. By way of example only, the fourth embodiment of the cluster generator 100 (FIG. 5) is included as part of the cluster deposition apparatus 101. As would be apparent to one of ordinary skill in the art, any embodiment of the cluster generator 100 could alternatively be included as part of the cluster deposition apparatus 101.

Referring to FIG. 7, the anode 110 may be electrically connected to a positive pole 114 of a power supply 116, and the hollow cathode 102 may be electrically connected to a negative pole 118 of the power supply 116. A gas discharge is generated when the working gas is introduced into the sputtering chamber 106 and a voltage ("discharge voltage") is applied across the anode 110 and cathode 102. Preferably, the discharge voltage is in the range of from ±(70 V to 1000 V), or from ±(90 V to 500 V). The discharge voltage may also be in the range of from ±(70 V to 500 V).

Due to the geometry and size of the hollow cathode, discharge voltages in the above-mentioned ranges are generally sufficient to provide a high ion current to the walls of the cathode without employing a magnetic field. In conventional sputtering processes, magnets are often used to control the path of electrons in the plasma, thereby increasing ionization of the working gas. With the hollow cathode geometry of the present apparatus, the wall(s) surrounding the sputtering chamber may cause electrons to be reflected back and forth within the chamber, generating numerous ionization events. The small volume of the sputtering chamber according to one embodiment may further contribute to efficient ionization by minimizing the distance over which electrons and ions must travel. With a rise in ionization events, the ion current may increase and the sputtering rate may correspondingly increase. However, it may be advantageous in some cases to apply a magnetic field to the sputtering chamber to further improve the sputtering efficiency.

Referring again to FIG. 7, the hollow cathode 102 may be grounded and a positive voltage may be applied to the anode 110. Alternatively, the anode 110 may be grounded and a negative voltage may be applied to the hollow cathode 102. An advantage of grounding the hollow cathode 102 may be that heat can be dissipated by thermal conduction to a reservoir 120 in contact with the walls 104 of the cathode 102 and to a vacuum housing 134, which will be discussed further below. Accordingly, water cooling of the hollow cathode 102 may not be necessary, as in traditional sputtering systems.

As shown in FIG. 7, the reservoir 120 may surround the cathode 102 and may include an inlet 122 and an outlet 124 for passage of a cooling fluid. Preferably, the cooling fluid is a cryogenic fluid such as liquid nitrogen. Flowing a cooling fluid such as liquid nitrogen through the reservoir 120 may increase the condensation rate of clusters from the vapor. Water may also be used as the cooling fluid, if desired.

According to the first embodiment of the cluster generator 100 shown in FIG. 2, the anode 110 includes a gas inlet 126 for introduction of the working gas into the sputtering chamber 106. The gas inlet 126 is preferably disposed at one of end of the sputtering chamber 106 in opposition to the aperture 142 in the hollow cathode 102. Such a configuration may be conducive to generating a flow of the working gas into and out of the sputtering chamber 106 to provide the gas. discharge and also to transport the vapor and/or clusters through the aperture 142. The anode 110 may also include multiple gas inlets.

Referring to FIG. 7, the anode 110 may be connected by a hollow electrically-insulated feedthrough 128 to a gas introduction valve 130 through an insulating tube 132. The electrically-insulated feedthrough 128 may be connected with the positive pole 114 of the power supply 116. With this configuration, a working gas may be controllably introduced into the sputtering chamber 106 through the gas inlet 126 in the hollow anode 110 while a voltage is being applied to the anode 110. Such a configuration may help to minimize the volume of the sputtering chamber 106 since space does not have to be allocated for a separate gas inlet. If desired, however, the working gas may be introduced into the chamber 106 through a gas inlet disposed elsewhere.

According to the second embodiment of the cluster generator 100 shown in FIG. 3, the hollow cathode 1102 may include the gas inlet 1126 for delivery of the working gas into the sputtering chamber 1106. The gas inlet 1126 is preferably disposed at one end of the sputtering chamber 1106 in opposition to the aperture 1142 in the anode 1110. This configuration may also be conducive to generating a flow of the working gas into and out of the sputtering chamber 1106. The hollow cathode 1102 may also include multiple gas inlets. As in the first embodiment, the anode 1110 may be electrically connected to a positive pole of a power supply, and the hollow cathode 1102 may be electrically connected to a negative pole of the power supply. The hollow cathode 1102 may be grounded and a positive voltage may be applied to the anode 1110, or the anode 1110 may be grounded and a negative voltage may be applied to the hollow cathode 1102.

The working gas preferably includes one or more inert (noble) gases. The working gas may be argon (Ar), helium (He), neon (Ne), krypton (Kr) or xenon (Xe), or a combination of these gases. For example, a mixture of Ar and He may be employed. Helium may be advantageous because of its high thermal conductivity, which may facilitate more rapid cooling, or quenching, of the sputtered vapor. The thermal conductivity of He is roughly 10 times higher than that of Ar. The working gas may also include a reactive gas, such as oxygen or nitrogen. Preferably, the pressure of the working gas in the sputtering chamber is sufficient to sustain a hollow cathode gas discharge and also to form the atom clusters. According to one embodiment, a gas pressure in the sputtering chamber 106 may be in the range of from about 0.5 Torr to about 5 Torr (about 0.07 kPa to about 0.67 kPa). Preferably, the gas pressure is in the range of from about 1 Torr to about 3 Torr (about 0.13 kPa to about 0.40 kPa).

The cluster deposition apparatus 101 may include a vacuum housing 134 that includes one or more additional chambers in addition to the first chamber 107. For example, referring to FIG. 7, the cluster deposition apparatus 101 may include three chambers, namely the first chamber 107, an intermediate chamber 136 and a deposition chamber 138. A thermally insulating housing 140 is disposed about a portion of the spacer region 108 of the first chamber 107, closing it off from the intermediate chamber 136. The hollow cathode 102 may be electrically connected to the vacuum housing 134, according to the first embodiment of the cluster generator 100, and the anode 110 may be electrically isolated from the vacuum housing 134. Alternatively, the anode may be electrically connected to the vacuum housing, consistent with the second embodiment of the cluster generator shown in FIG. 3, and the hollow cathode and the gas inlet may be electrically isolated from the vacuum housing.

Referring again to FIG. 7, the aperture 142 of the cluster generator 100 may transition into an expansion nozzle 144. The expansion nozzle 144 may be disposed in the intermediate chamber 136 adjacent to the aperture 142. A length of the expansion nozzle 144 may range from about 0.5 cm to about 4 cm. The length of the expansion nozzle may also lie in the range of from about 1 cm to about 3 cm. The expansion nozzle 144 has a tapered shape. Preferably, the cross-sectional area of the expansion nozzle 144 increases in a direction away from the aperture 142, such that vapor or atom clusters passing through the expansion nozzle 144 may be further cooled by expansion. The increase may be linear or non-linear. At least a portion of the atom clusters generated during the process may be formed or grow in the expansion nozzle 144 by vapor condensation. The expansion nozzle 144 may have a conical shape with a substantially circular cross-section, as shown in the embodiment of FIG. 7. Alternatively, the expansion nozzle 144 may have a different cross-section, such as, for example, an oval, square, rectangular, or polygonal cross-section. An inner diameter or other linear dimension of the cross-section of the expansion nozzle 144 may increase from, for example, about 0.2 cm to about 1.5 cm along the length of the nozzle 144. Alternatively, the diameter or other linear dimension of the cross-section may expand from about 0.2 cm to about 1 cm along the length of the nozzle 144.

The reservoir 120 described above may be in contact with the expansion nozzle 144, as shown in FIG. 7, to further enhance the cooling effect of the expansion nozzle 144. Cooling of the expansion nozzle 144 may advantageously expand the range of parameters suitable for cluster generation, and may enable the formation of clusters from materials that do not form clusters readily. For some materials, however, the expansion nozzle 144 may not be necessary for cluster formation.

A vacuum pump 146 is attached to the intermediate chamber 136, as shown in FIG. 7. Preferably, the vacuum pump 146 is capable of pumping at a rate of from about 1,000 liters per second to about 2,000 liters per second. A commercially available turbomolecular pump, cryogenic pump, ion pump, or diffusion pump may be used, for example. The gas pressure in the intermediate chamber 136 is preferably maintained in the range of from about $10^{-3}$ Torr to about $10^{-1}$ Torr (about $10^{-4}$ kPa to about $10^{-2}$ kPa). The gas pressure may be monitored by a pressure gauge disposed in the intermediate chamber 136. Optimally, a ratio of the gas pressure in the sputtering chamber 106 to the gas pressure in the intermediate chamber 136 exceeds $10^4$ to $10^5$ for gas cluster formation and $10^2$ to $10^3$ for metal cluster formation.

The intermediate chamber 136 and the deposition chamber 138 are separated from each other by a wall 148 including a second aperture 150. A second expansion nozzle 152 disposed within the wall 148 includes the second aperture 150 and creates a passageway between the intermediate chamber 136 and the deposition chamber 138. The passageway allows a further decrease in pressure from the intermediate chamber 136 to the deposition chamber 138. Also, a beam of clusters may be formed through the passageway. The second expansion nozzle 152 preferably has a length in the range of from about 0.5 to about 4 cm and a tapered shape. The length may also be in the range of from about 1 cm to about 3 cm. The second expansion nozzle 152 may have a conical shape with a substantially circular cross-section. Alternatively, the second expansion nozzle 152 may have a different cross-section (e.g., oval, square, rectangular, or polygonal). A cross-sectional area of the second expansion nozzle 152 preferably increases in a direction of the deposition chamber 138, as shown in the embodiment of FIG. 7. The increase may be linear or nonlinear. For example, the passageway through the second expansion nozzle 152 may have a diameter or other linear dimension of the cross-section that expands from, for example, about 0.2 cm to about 1 cm along the length of the nozzle 152. Alternatively, the diameter or other linear dimension may expand from about 0.3 cm to about 0.8 cm along the length of the nozzle 152.

As shown in FIG. 7, a second vacuum pump 154 is attached to the deposition chamber 138. Preferably, the second vacuum pump 154 is capable of pumping at a rate of from about 1,000 liters per second to about 2,000 liters per second. A commercially available turbomolecular pump, cryogenic pump, ion pump, or diffusion pump may be used, for example. The gas pressure in the deposition chamber 138 is preferably maintained in the range of from about $10^{-6}$ Torr to about $10^{-4}$ Torr (about $10^{-7}$ kPa to about $10^{-5}$ kPa). A pressure gauge, such as an ionization gauge, may be mounted in the deposition chamber 138 and used to monitor the gas pressure.

A substrate 156 or other collection device for the deposition or collection of clusters may be placed in the deposition chamber 138. As shown in FIG. 7, a vacuum feedthrough 158 connects the substrate 156 with an acceleration power supply 160. According to one embodiment, at least a portion of the clusters pass through the second aperture 150 and are deposited on the substrate 156 in the deposition chamber 138. Alternatively, collection or deposition of the clusters may take place in the intermediate chamber 136 and the second opening, second expansion nozzle and the deposition chamber may not be included as part of the cluster deposition apparatus 101. It is also envisioned that a substrate 156 or other collection device may be disposed within the sputtering chamber 106 itself for the deposition and/or collection of clusters. For example, it is contemplated that a continuous substrate such as a rod, wire, ribbon or sheet may be passed through the hollow cathode for the continuous deposition of clusters. For example, the continuous substrate may be introduced into the sputtering chamber through the gas inlet and removed from the sputtering chamber through the aperture.

Figure 8:
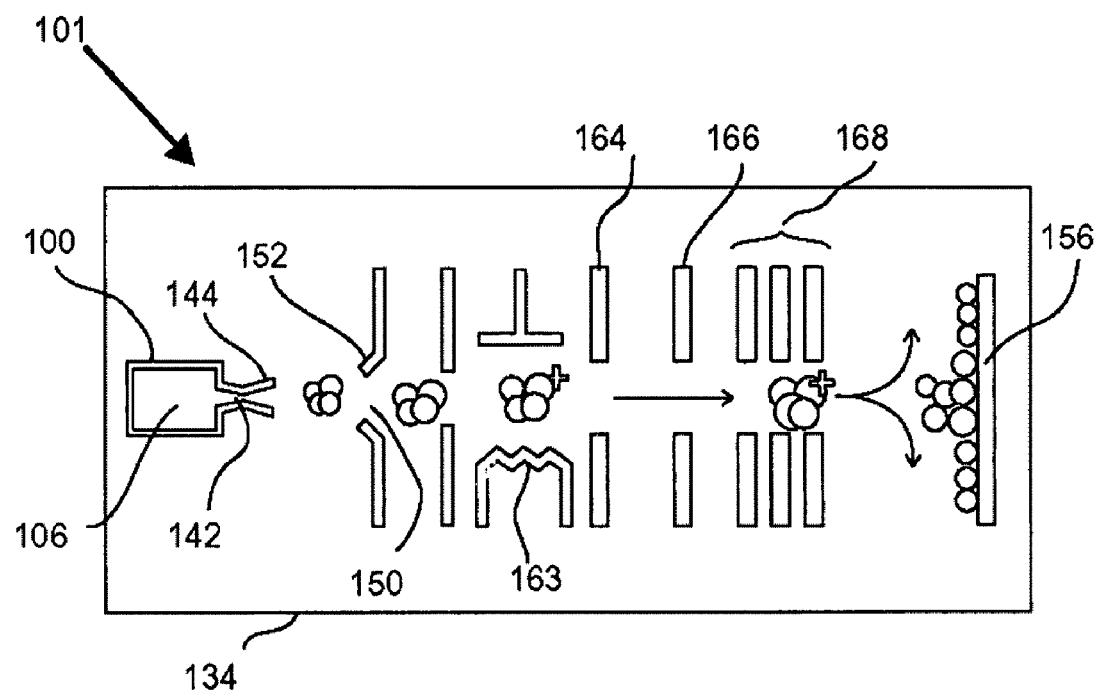
FIG. 8 is a schematic of a cluster deposition apparatus according to another embodiment.

Referring to FIG. 8, the cluster deposition apparatus 101 may further include a filament 163 or other device to generate electrons and ionize the atom clusters. Ionized clusters may be accelerated toward the substrate 156 when a voltage is applied via the acceleration power supply 160 shown in FIG. 7. Generally, voltages in the range of from $\pm(10\,V$ to a $1000\,V)$ are suitable. The deposition apparatus 101 may further include an extraction electrode 164 for generating a beam of atom clusters, and additional electrodes and lenses 166, 168 to accelerate and/or deflect the beam. A transverse electric field may also be used to separate atom clusters by mass. The deposition apparatus 101 may include one or more additional sources (e.g., magnetron sputtering sources, evaporation sources, laser ablators, or combinations thereof) to enable co-deposition or alternating deposition of thin films along with the atom clusters. Referring for example to FIG. 7, a magnetron sputtering source 162 may be placed in the deposition chamber 138 and oriented in a direction of the substrate 156. Also, according to alternative embodiments in which deposition of the atom clusters occurs in the intermediate chamber 136 and a third chamber is not included as part of the vacuum housing 134, the components (e.g., substrate, electrodes, sources, etc.) described above may be included in the intermediate chamber 136.

The clusters of atoms or molecules ("atom clusters") formed by the cluster generator may have an average size in the range of from about 1 nm to about 100 nm. The atom clusters may alternatively be referred to as nanocrystals or nanoparticles, due to their sub-100 nm size. Preferably, the clusters an average size in the range of from about 1 nm to about 20 nm. Even more preferably, the average size is in the range of from about 1 nm to about 10 nm. The size of the atom clusters may be influenced by the discharge voltage, external cooling of components of the apparatus (e.g., the hollow cathode and expansion nozzle), the pressure of the working gas in the sputtering chamber, the working gas species, and the flow rate of the working gas through the sputtering chamber. Generally speaking, the size of the atom clusters may be controlled by balancing the sputtering rate and the working gas pressure with the flow rate of the working gas through the sputtering chamber. The cluster size or particle size distribution may be narrow or broad, depending on the process conditions, as further discussed below. The clusters may be spherical in morphology or have some other shape, such as a spheroidal, cubic, or acicular morphology, in particular if they coalesce with each other on the substrate. The clusters may be crystalline or amorphous.

The atom clusters may be formed of a wide variety of materials including metals, alloys, semiconductors or ceramics (dielectrics). Preferably, the atom clusters are formed from conductive or semiconductive materials. For example, the clusters may include one or more of the following elements: Al, Sc, Ti, V, Cr, Mn, Fe, Co, Ni, Cu, Zn, Y, Zr, Nb, Mo, Ru, Rh, Pd, Ag, Cd, In, La, Ce, Pr, Nd, Pm, Sm, Eu, Gd, Tb, Dy, Ho, Er, Tm, Yb, Lu, Hf, Ta, W, Re, Os, Ir, Pt, Au, Pb, Bi, Po, Th, U, Np, Pu, Si, C, Ga, Ge, As, Se, Sn, Sb, Te, Li, Be, Na, Mg, K, Ca, Rt, Sr, or Ba. As noted above, the clusters may be single component materials, such as pure metals, or multi-component materials, such as alloys or compounds. Compound clusters (e.g., oxides, carbides, nitrides, or borides) may be formed by carrying out the sputtering process in a reactive gas environment with an elemental target. Radiofrequency (RF) or pulsed DC sputtering may be advantageously employed for nonconductive cathode materials.

Figure 9:
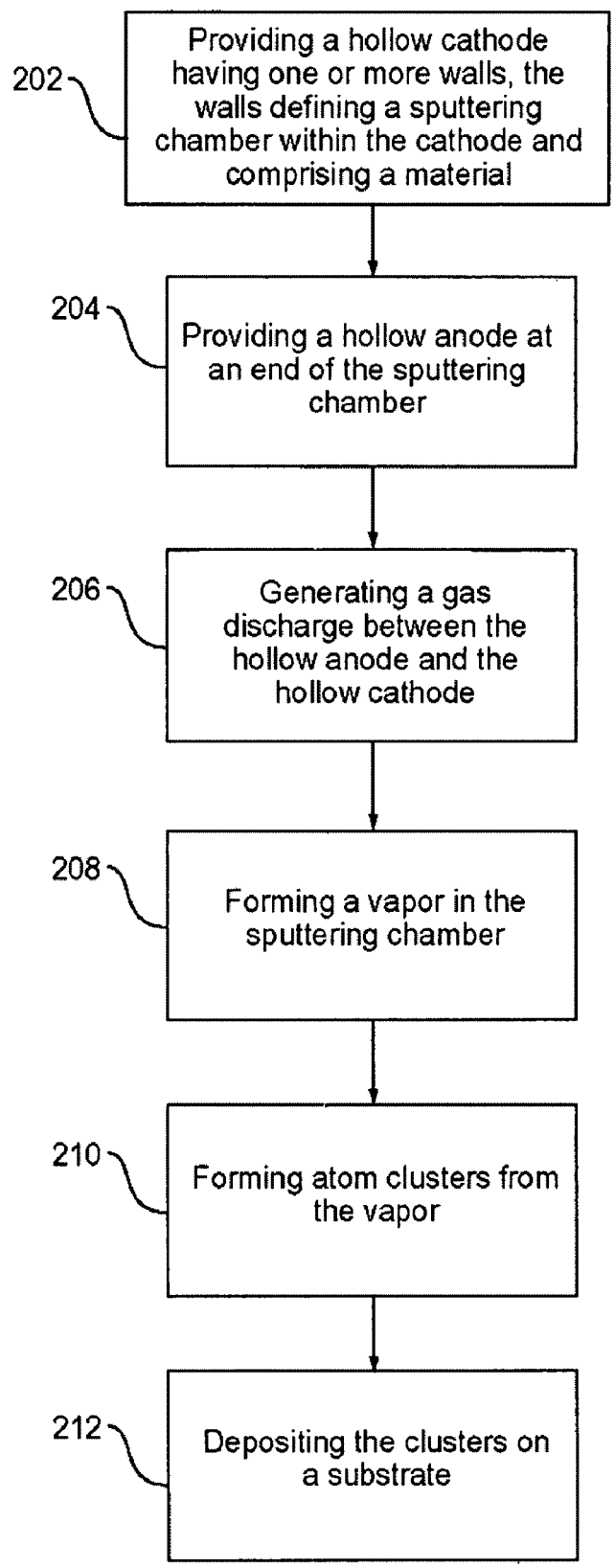
FIG. 9 is a flow chart showing one embodiment of a method of generating clusters.

A method of making atom clusters is also described herein. FIG. 9 is a flow chart illustrating the method according to one embodiment. Referring to FIG. 9, the method includes providing 202 a hollow cathode that includes one or more walls. The walls define a sputtering chamber within the hollow cathode and include a material to be sputtered. An anode is provided 204 at an end of the sputtering chamber, and a gas discharge is generated 206 between the anode and the hollow cathode. Preferably, the anode is hollow. At least a portion of the material is sputtered (ejected) from the walls, and a vapor is formed 208 in the sputtering chamber. Atom clusters are formed 210 from the vapor. Preferably, at least a portion of the atom clusters are formed in the sputtering chamber. The clusters may be deposited 212 on a substrate or another collection device. According to one embodiment, the clusters may be deposited with sputtered atoms that have not condensed into clusters.

The hollow cathode and the anode may be provided 202, 204 as described above. To generate 206 the gas discharge, a working gas (e.g., an inert gas) is introduced into the sputtering chamber and a discharge voltage is applied across the anode and the cathode. According to one embodiment, applying the voltage comprises grounding the hollow cathode and applying a positive voltage to the anode. Alternatively, the anode may be grounded and a negative voltage may be applied to the hollow cathode. Preferably, the discharge voltage is in the range of from in the range of from 70 V to 1000 V, or from −70 V to −1000 V. More preferably, the discharge voltage is in the range of from 70 V to 500 V, or from −70 V to −500 V. A direct current (dc) voltage is generally applied; however, alternating current (ac) or pulsed voltages may also be applied under some circumstances. For example, if the working gas includes a reactive gas, ac voltages may be preferred. Due to the geometry and size of the hollow cathode, discharge voltages within any of the preceding ranges are generally sufficient to provide a high ion current to the walls of the cathode, as discussed above. In some cases, a magnetic field (e.g., an axial magnetic field) may be applied to enhance the ionization.

To form the vapor 208 in the sputtering chamber, at least a portion of the material may be sputtered from the walls of the hollow cathode.

Forming the atom clusters 210 may entail maintaining a working gas pressure sufficient to condense atom clusters from the vapor. Preferably, the gas pressure in the sputtering chamber may range from about 1 Torr to about 3 Torr. To maintain a sufficient gas pressure, a flow of the working gas into and out of the sputtering chamber may be controlled. According to one embodiment of the method, the working gas may be controllably introduced into the sputtering chamber through a gas inlet in the hollow anode and may be controllably removed from the sputtering chamber through an aperture in the hollow cathode for extracting the atom clusters. A gas introduction valve in communication with a source of the working gas (e.g., an inert gas cylinder) may be used to controllably introduce the working gas into the sputtering chamber. A vacuum pump with controlled speed (e.g., with a regulated throttle valve) in communication with the aperture in the hollow cathode may be used to controllably remove the working gas from the sputtering chamber, as described above.

For some materials, forming the atom clusters 210 may entail cooling the hollow cathode. For example, a cooling fluid may be passed through a reservoir in contact with the walls of the hollow cathode. Preferably, the cooling fluid is a cryogenic fluid such as liquid nitrogen. Accordingly, the cooling rate or quench rate of the vapor may be increased and a larger proportion of atom clusters may be formed in the sputtering chamber.

According to another embodiment, formation of the atom clusters 210 may be facilitated by transporting at least a portion of the vapor through a passageway (e.g., expansion nozzle) having an increasing cross-sectional area (e.g., diameter) along a length thereof. The vapor may be transported by entrainment in the working gas. The expansion through the passageway may provide further cooling of the vapor and, accordingly, promote atom cluster formation and/or growth. Additionally, the passageway itself may be cooled. A reservoir such as the one in contact with the hollow cathode may be placed in contact with the passageway, and a cooling fluid may be flowed through the reservoir. Preferably, the cooling fluid is a cryogenic fluid such as liquid nitrogen. According to one embodiment, at least a portion of the atom clusters are formed or grow in size in the passageway. Atom clusters may grow in size by the condensation of new atoms or by cluster coalescence. Additionally, including helium in the working gas may increase gas cooling in the passageway and also in the sputtering chamber (interior of the hollow cathode).

As described above, the hollow cathode may include two or more materials. Accordingly, forming atom clusters 210 from the vapor may entail forming atom clusters (e.g., single-component atom clusters) collectively comprising the two or more materials. It is also contemplated that forming atom clusters 210 from the vapor may entail forming multicomponent atom clusters separately comprising the two or more materials.

The method may further include depositing 212 the atom clusters on a substrate. The clusters may be transported (e.g., by entrainment in the flow of the working gas) to a separate deposition chamber for deposition. Preferably, at least a portion of the atom clusters not transported to the deposition chamber are redeposited on the walls of the hollow cathode and sputtered again, as described above. It is also preferred that any vapor that is not condensed into atom clusters is redeposited on the walls of the hollow cathode and sputtered again.

Figure 10:
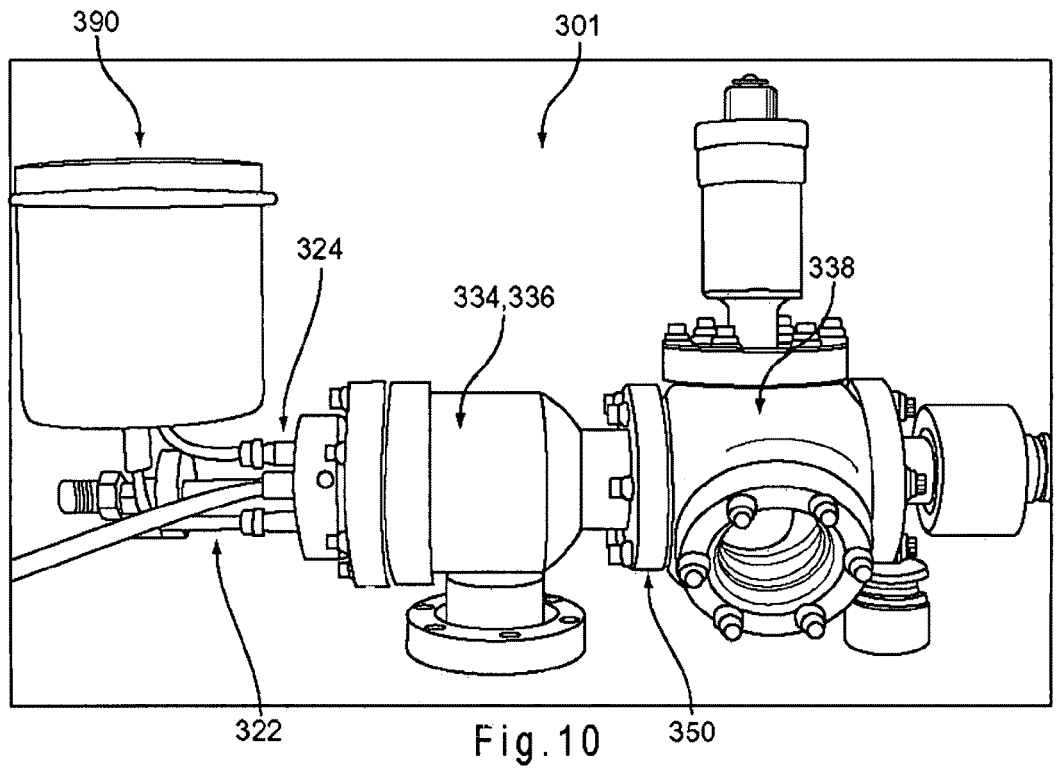
FIG. 10 is a perspective view of a cluster deposition apparatus including a cluster generator and a small deposition chamber according to one embodiment.

FIG. 10 shows a perspective view of an exemplary cluster deposition apparatus 301 according to one embodiment. The apparatus 301 includes a cluster generator 100 (see FIG. 7) and intermediate chamber 336 within a vacuum housing 334. The intermediate chamber 336 is in communication with a small deposition chamber 338 via the port 350, according to this embodiment. Also visible in FIG. 10 are a liquid nitrogen dewar 390 and the inlet 322 and outlet 324 to a reservoir 120 (see FIG. 7) in the intermediate chamber 336. The small deposition chamber 338 may be employed for in-situ deposition, characterization and/or further processing of the generated atom clusters.

Figure 11:
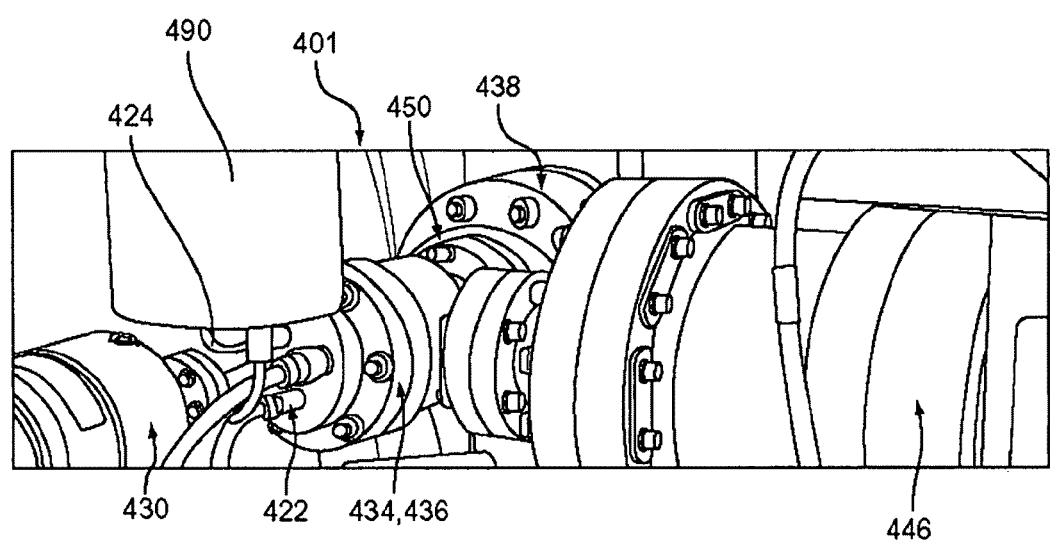
FIG. 11 is a perspective view of a cluster deposition apparatus including a cluster generator and a large deposition chamber according to one embodiment.

FIG. 11 shows a perspective view of another exemplary cluster deposition apparatus 401 according to another embodiment. The apparatus 401 includes a cluster generator 100 and an intermediate chamber 436 within a vacuum housing 434. The intermediate chamber 436 is in communication with a large deposition chamber 438 via the port 450, according to this embodiment. Also visible in this figure are a liquid nitrogen dewar 490 and cooling fluid inlet 422 and outlet 424, a pressure control and measurement device 430 for introduction of the working gas, and a differential turbomolecular pump 446 attached to the intermediate chamber 436. The large deposition chamber 438 may be employed for in-situ deposition, characterization and/or further processing of the generated atom clusters.

EXAMPLE

Figure 12:
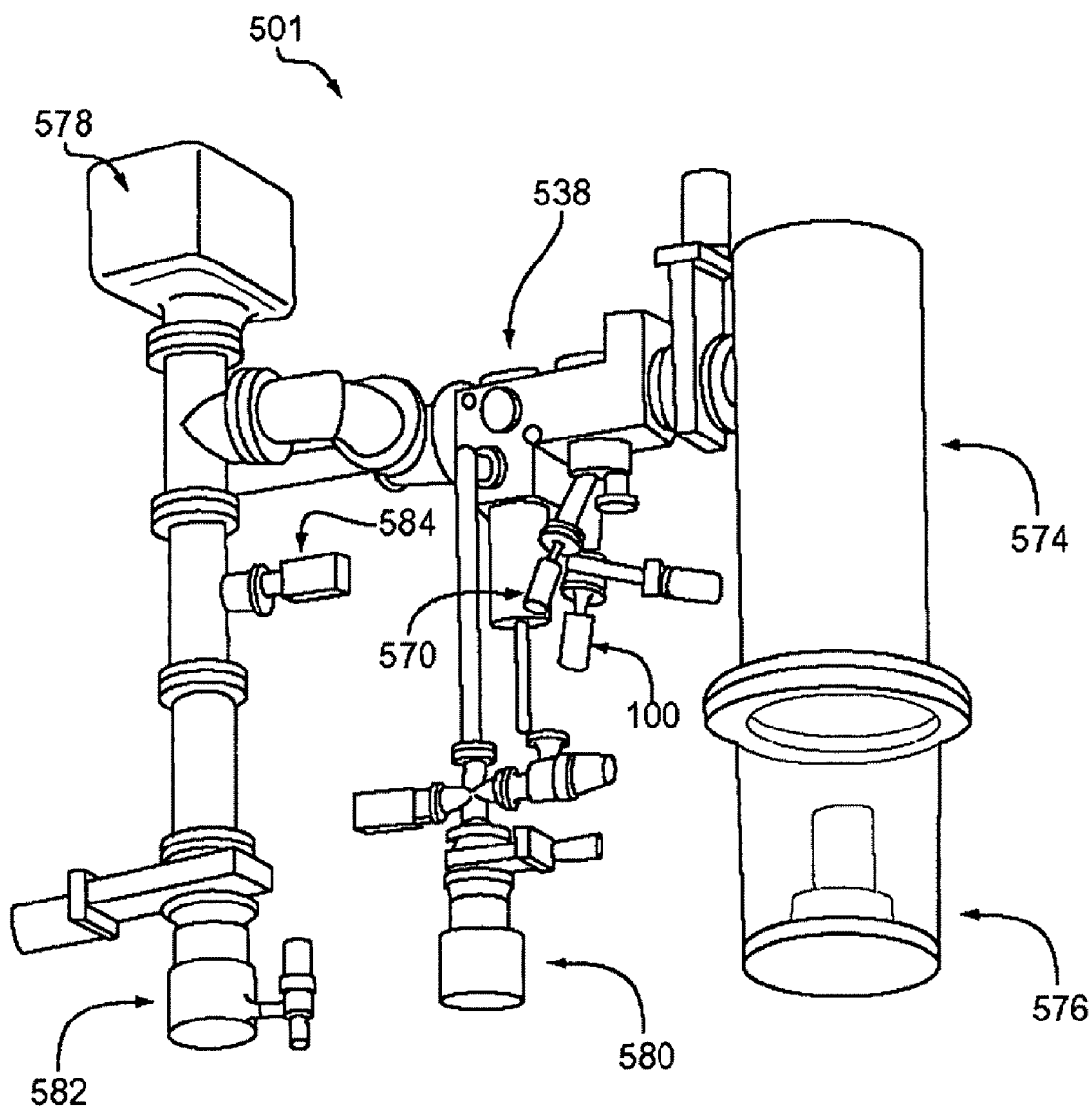
FIG. 12 is a perspective view of a cluster deposition apparatus including a cluster generator integrated with a scanning transmission electron microscope according to one embodiment.

A compact, ultra-high vacuum (UHV) cluster generator has been built. Referring to FIG. 12, the cluster generator 100 was installed on a UHV analytical scanning transmission electron microscope (STEM HB501) to form a cluster deposition apparatus 501, according to another embodiment. The cluster deposition apparatus 501 allowed for in-situ deposition and characterization of the generated atom clusters. In other words, it was possible to generate, deposit and characterize the atom clusters without removal from a Vacuum environment. The apparatus 501 includes the cluster generator 100, an effusion cell 570, a sample loadlock and deposition chamber 538, the STEM chamber 574 and electron gun 576, as well as several pumps (an ion pump 578 and two turbomolecular pumps 580, 582) and a pressure gauge 584.

Atom clusters were generated using a hollow cathode silver (Ag) target and the process conditions summarized in Table 1. The atom clusters were deposited on a substrate in the STEM HB501. FIGS. 13A-13D are transmission electron micrographs showing the atom clusters produced in Experiments A-D. The magnification of the bottom micrograph 194 of FIGS. 13A-13B and 13D and the top micrograph of FIG. 13C is the same; the scale bar for each micrograph is the same and corresponds to 20 nm. The magnification of the top micrographs 196 is not the same for each figure and is indicated by the respective scale bars. The black and white plot 198 inserted within each figure represents the cluster size distribution determined from the microscopy data for each experiment.

Figure 13A:
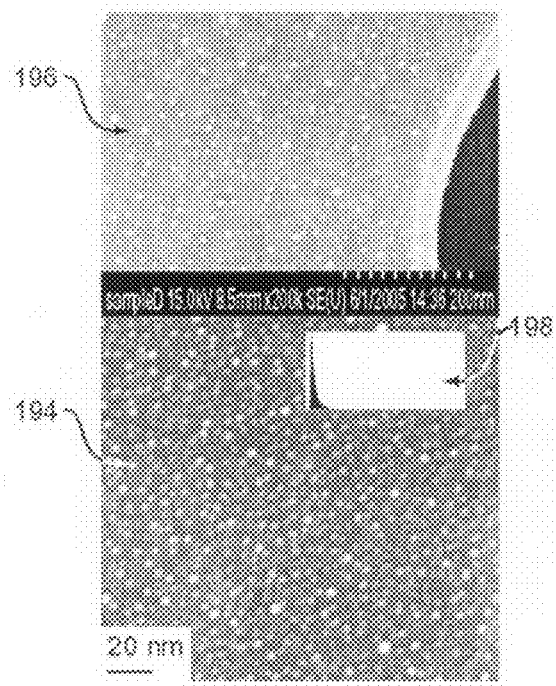
FIGS. 13A-13D show transmission electron micrographs of clusters deposited and studied in the cluster deposition system of FIG. 12.
Figure 13B:
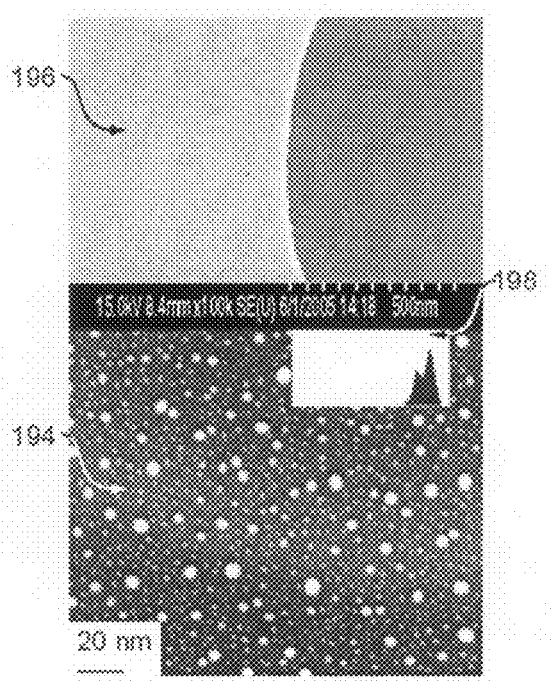
Figure 13C:
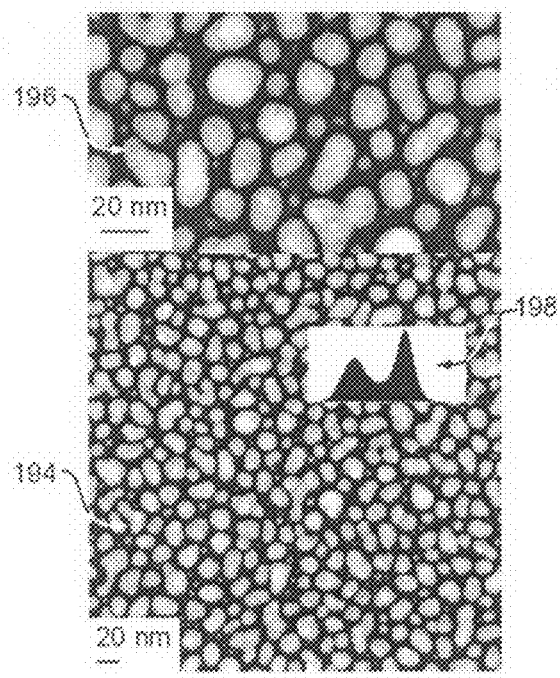
Figure 13D:
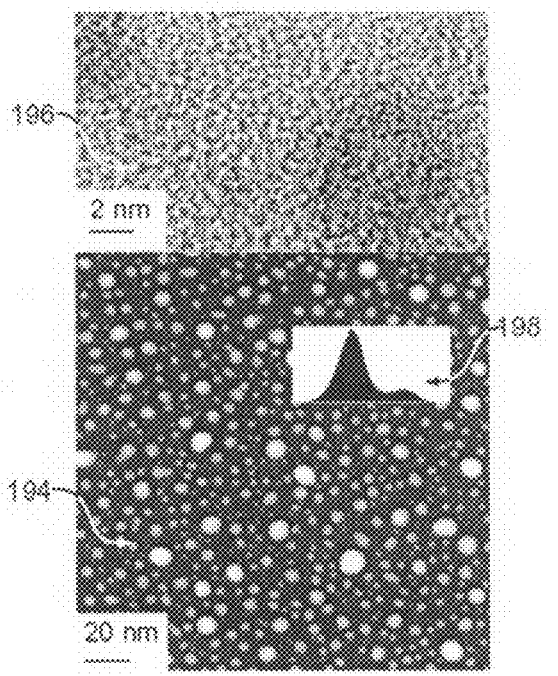

Atom clusters of 1-3 nm in diameter were obtained from the cluster generator using pure Ar as the working gas at room temperature (Deposition A and FIG. 13A). Using a combination of Ar and He as the working gas at room temperature (Deposition B and FIG. 13B), a group of larger atom clusters were obtained, possibly due to enhanced cluster condensation and/or growth due to cooling by He expansion in the expansion nozzle, as discussed previously. When additional cooling with liquid nitrogen was applied, larger atom clusters of 20-30 nm were deposited and a coalescence process was initiated on the substrate (Depositions C and D; FIGS. 13C and 13D).

TABLE 1

Process Parameters of Experiments A-D.

| Process Parameters | Experiment A | Experiment B | Experiment C | Experiment D |
|---|---|---|---|---|
| Gas species | Ar | Ar/He | Ar/He | Ar/He |
| Pressure (Torr) | ~1.3 | ~1.0/~0.3 | ~1.0/~0.3 | ~1.0/~0.3 |
| Current (mA) | 20 | 5 | 20 | 5 |
| Deposition Time (min) | 0.5 | 7 | 2 | 7 |
| Cooling? | Room temp. | Room temp. | Liquid $N_2$ cooling | Liquid $N_2$ cooling |
| Equivalent Thickness (nm) | | ~0.447 | ~6.37 | ~1.14 |
| Deposition Rate (Å/sec) | | ~0.011 | ~0.53 | ~0.027 |

A cluster generator including a hollow cathode and a method of making atom clusters have been described herein. The cluster generator may be compact in size and portable to facilitate attachment to and detachment from small or large vacuum chambers. Accordingly, atom clusters produced by the cluster generator may be deposited, characterized and/or further processed without removal from a vacuum environment. Due to the size and geometry of the hollow cathode, atom clusters may be generated efficiently without a magnetron. Atom clusters may be produced at low voltages (less than 1000 V). Also, material utilization may be very high since sputtered material that deposits on the walls of the hollow cathode (instead of a substrate or collection device) may be re-sputtered. Atom clusters including multiple elements may be obtained by constructing the hollow cathode of sections (e.g., washers) of different materials. By using a hollow anode, the working gas may be conveniently introduced into the chamber through a gas inlet within the anode or the hollow cathode. Also, according to some embodiments, the cluster generator may be configured for large-scale production of atom clusters.

Although the present invention has been described with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. An apparatus for producing a plurality of atom clusters, the apparatus comprising:
a hollow cathode comprising one or more walls, the walls defining a sputtering chamber within the hollow cathode and comprising a material to be sputtered;
a hollow anode at a first end of the sputtering chamber;
a cryogenically cooled reservoir surrounding the sputtering chamber and including an inlet and an outlet for passage of a cryogenic fluid;
an aperture between the sputtering chamber and a second chamber for passage of atom clusters therethrough, the aperture having a small size relative to the sputtering chamber for maintaining a higher pressure in the sputtering chamber than in the second chamber, the atom clusters being formed when a gas discharge is generated in the sputtering chamber; and
an expansion passageway in the second chamber disposed adjacent to the aperture, the expansion passageway having a cross-sectional area that increases in a direction away from the aperture, wherein the cryogenically cooled reservoir is in contact with the expansion passageway.

2. The apparatus of claim 1, wherein the hollow anode comprises at least one gas inlet for introduction of a working gas into the sputtering chamber, the aperture being disposed at a second end of the sputtering chamber.

3. The apparatus of claim 1, wherein the hollow cathode comprises at least one gas inlet for introduction of a working gas into the sputtering chamber, the aperture being disposed at the first end of the sputtering chamber.

4. The apparatus of claim 1, wherein the sputtering chamber has a volume of not greater than about 10 $cm^3$.

5. The apparatus of claim 1, wherein the hollow cathode comprises a single wall and a generally cylindrical shape.

6. The apparatus of claim 1, wherein the hollow cathode comprises two planar walls having a substantially uniform distance therebetween.

7. The apparatus of claim 1, wherein the hollow cathode comprises two nonplanar walls having a substantially uniform distance therebetween.

8. The apparatus of claim 1, wherein the one or more walls of the hollow cathode comprise a stack of two or more sections, each of the sections comprising a different material.

9. The apparatus of claim 1, wherein the apparatus does not include any magnets for generating a magnetic field in the sputtering chamber.

10. The apparatus of claim 1, further comprising one or more magnets adjacent to the hollow cathode for generating a magnetic field in the sputtering chamber.

11. The apparatus of claim 1, wherein the cryogenically-cooled reservoir includes an inlet and an outlet for passage of liquid nitrogen, the cryogenically-cooled reservoir being a liquid nitrogen-cooled reservoir.

12. The apparatus of claim 1, wherein one dimension of the aperture is substantially larger than the other two dimensions of the aperture.

13. The apparatus of claim 1, further comprising a third chamber in communication with the second chamber by way of a second aperture in a wall between the second chamber and the third chamber.

14. The apparatus of claim 13, wherein a second expansion passageway passing through the wall includes the second aperture, a cross-sectional area of the second expansion passageway increasing in a direction of the third chamber.

15. The apparatus of claim 1, wherein the hollow anode comprises a gas inlet for introducing a working gas into the sputtering chamber and the hollow cathode comprises a single wall and a generally cylindrical shape,
wherein the sputtering chamber has a volume of not greater than about 10 $cm^3$ and the apparatus does not include any magnets for generating a magnetic field in the sputtering chamber,
wherein the aperture is in the hollow cathode, and an expansion passageway in the second chamber is disposed adjacent to the aperture, the expansion passageway having a cross-sectional area that increases in a direction away from the aperture, and
wherein the cryogenically-cooled reservoir includes an inlet and an outlet for passage of liquid nitrogen, the cryogenically-cooled reservoir being a liquid nitrogen-cooled reservoir.

16. The apparatus of claim 1, wherein the hollow cathode comprises two planar walls having a substantially uniform distance therebetween and includes a gas inlet for introducing a working gas into the sputtering chamber, wherein the aperture is in the hollow anode, the aperture having one dimension substantially larger than the other two dimensions, and an expansion passageway in the second chamber is disposed adjacent to the aperture, the expansion passageway having a cross-sectional area that increases in a direction away from the aperture, and further comprising a reservoir in contact with the walls of the hollow cathode and in contact with the expansion passageway, the reservoir including an inlet and an outlet for passage of a cryogenic fluid.

17. A method for producing atom clusters, the method comprising:

providing a hollow cathode having one or more walls, the walls defining a sputtering chamber within the hollow cathode and comprising at least one material to be sputtered;

providing a hollow anode at an end of the sputtering chamber;

passing a cryogenic fluid through a reservoir surrounding the sputtering chamber;

generating a gas discharge between the hollow anode and the hollow cathode;

forming a vapor of the material in the sputtering chamber;

forming atom clusters from the vapor, a gas pressure in the range of from about 1 Torr to about 3 Torr being maintained in the sputtering chamber;

extracting the atom clusters from the sputtering chamber through an aperture between the sputtering chamber and a second chamber, the aperture having a small size relative to the sputtering chamber; and transporting at least a portion of the vapor and the atom clusters through a passageway adjacent to the aperture, the passageway having an increasing cross-sectional area along a length thereof and being cooled with a cryogenic fluid.

18. The method of claim 17, wherein generating the gas discharge comprises introducing a working gas into the sputtering chamber through a gas inlet in one of the hollow anode and the hollow cathode and applying a voltage across the hollow anode and the hollow cathode.

19. The method of claim 17, wherein applying the voltage comprises applying a dc voltage in the range of from $\pm(70\,V$ to $500\,V)$.

20. The method of claim 17, wherein applying the voltage comprises grounding the hollow cathode and applying a positive voltage to the hollow anode.

21. The method of claim 17, wherein applying the voltage comprises grounding the hollow anode and applying a negative voltage to the hollow cathode.

22. The method of claim 17, wherein generating the gas discharge does not comprise applying a magnetic field to the sputtering chamber.

23. The method of claim 17, wherein generating the gas discharge comprises applying a magnetic field to the sputtering chamber.

24. The method of claim 17, wherein forming the atom clusters comprises maintaining the gas pressure in the sputtering chamber in the range of from about 1 Torr to about 3 Torr by controllably introducing a working gas into the sputtering chamber through a gas inlet in one of the hollow cathode and the hollow anode and controllably removing the working gas from the sputtering chamber through an aperture in the other of the hollow cathode and the hollow anode.

25. The method of claim 17, wherein the hollow cathode comprises two or more materials, and wherein forming the atom clusters comprises forming atom clusters collectively comprising the two or more materials.

26. The method of claim 17, wherein the hollow cathode comprises two or more materials, and wherein forming the atom clusters comprises forming multicomponent atom clusters separately comprising the two or more materials.

27. The method of claim 17, wherein at least a portion of sputtered material is deposited on the walls of the hollow cathode and sputtered again.

28. The apparatus of claim 1, wherein the sputtering chamber comprises a pressure in the range of from about 1 Torr to about 3 Torr, and the second chamber comprises a pressure in the range of from about $10^{-3}$ Torr to about $10^{-1}$ Torr.

29. The method of claim 17, wherein the cryogenic fluid is liquid nitrogen.

* * * * *